(12) United States Patent
Tomono et al.

(10) Patent No.: US 10,095,811 B2
(45) Date of Patent: Oct. 9, 2018

(54) THREE-DIMENSIONAL MODEL GENERATING METHOD, THREE-DIMENSIONAL MODEL GENERATING SYSTEM, AND A THREE-DIMENSIONAL MODEL GENERATING PROGRAM

(71) Applicant: MITUTOYO CORPORATION, Kanagawa (JP)

(72) Inventors: Yasushi Tomono, Tokyo (JP); Takanori Asamizu, Hokkaido (JP)

(73) Assignee: MITUTOYO CORPORATION, Kanagawa (JP)

( * ) Notice: Subject to any disclaimer, the term of this patent is extended or adjusted under 35 U.S.C. 154(b) by 356 days.

(21) Appl. No.: 14/832,217

(22) Filed: Aug. 21, 2015

(65) Prior Publication Data

US 2016/0055266 A1  Feb. 25, 2016

(30) Foreign Application Priority Data

Aug. 25, 2014  (JP) ................................ 2014-170656

(51) Int. Cl.
G06F 17/50  (2006.01)

(52) U.S. Cl.
CPC .......... *G06F 17/50* (2013.01); *G06F 17/5086* (2013.01); *G06F 17/5004* (2013.01); *G06F 17/5095* (2013.01)

(58) Field of Classification Search
USPC ............................................. 703/9, 7, 20, 2
See application file for complete search history.

(56) References Cited

U.S. PATENT DOCUMENTS

| | | | | |
|---|---|---|---|---|
| 3,699,245 A | * | 10/1972 | Scott | H04N 13/0402 348/209.99 |
| 4,297,031 A | * | 10/1981 | Hamar | G01B 11/27 356/138 |
| 4,501,601 A | * | 2/1985 | Haupt | C03B 19/1423 65/17.3 |
| 5,283,641 A | * | 2/1994 | Lemelson | H04N 5/7822 348/142 |

(Continued)

FOREIGN PATENT DOCUMENTS

| | | |
|---|---|---|
| JP | 2001-241941 | 9/2001 |
| JP | 2003-345839 | 12/2003 |

OTHER PUBLICATIONS

U.S. Appl. No. 14/832,329 to Yasushi Tomono et al., filed Aug. 21, 2015.

*Primary Examiner* — Thai Phan
(74) *Attorney, Agent, or Firm* — Greenblum & Bernstein, P.L.C.

(57) ABSTRACT

In a three-dimensional model generating method, a predetermined plane element defining a three-dimensional model element is selected from measurement data, which includes measurement point group data obtained by measuring a measured object, a type of a plane element, and geometric values of the plane element; a condition required for generating the three-dimensional model element is obtained; the three-dimensional model element is generated using the selected plane element and the obtained condition; and the three-dimensional model of the measured object is generated using one or a plurality of three-dimensional model elements.

12 Claims, 16 Drawing Sheets

(56) References Cited

U.S. PATENT DOCUMENTS

| | | | | |
|---|---|---|---|---|
| 5,717,401 A | * | 2/1998 | Sabet-Peyman | G01S 7/4802 324/76.37 |
| 6,242,743 B1 | * | 6/2001 | DeVito | A61B 6/037 250/363.01 |
| 6,328,215 B1 | * | 12/2001 | Dickson | B82Y 15/00 235/462.01 |
| 6,502,056 B2 | | 12/2002 | Kikuchi et al. | |
| 6,803,912 B1 | * | 10/2004 | Mark | G06T 15/00 345/427 |
| 2012/0331269 A1 | * | 12/2012 | Aras | G06F 15/17375 712/29 |

* cited by examiner

THREE-DIMENSIONAL MODEL GENERATING METHOD, THREE-DIMENSIONAL MODEL GENERATING SYSTEM, AND A THREE-DIMENSIONAL MODEL GENERATING PROGRAM

CROSS-REFERENCE TO RELATED APPLICATIONS

The present application claims priority under 35 U.S.C. § 119 of Japanese Application No. 2014-170656, filed on Aug. 25, 2014, the disclosure of which is expressly incorporated by reference herein in its entirety.

BACKGROUND OF THE INVENTION

1. Field of the Invention

The present invention relates to a three-dimensional model generating method, a three-dimensional model generating system, and a three-dimensional model generating program generating a three-dimensional model in a CAD system using measurement data obtained by measuring a measured object with a coordinate measuring device.

2. Description of Related Art

Conventionally, as an example of a reverse engineering method or a simple product design method, a technology is known in which a three-dimensional model is automatically generated in a CAD system using measurement data obtained by measuring a measured object with a coordinate measuring device. Technology disclosed by Japanese Patent Laid-open Publication No. 2003-345839, for example, is configured such that data for plane elements representing surfaces of a measured object is created using measurement data (point group data) obtained by measuring the measured object, the plane elements are connected and compound plane element data representing linking surfaces is created, and a three-dimensional solid model is generated using a space enclosed by the compound plane element data.

However, in the above-described conventional three-dimensional model generating method, due to a measurement error when measuring the measured object with the coordinate measuring apparatus or a conversion error in converting from measurement data to plane element data, a situation may arise in which positions connecting the plane element data are offset and unable to form a connection, making it difficult to generate a three-dimensional model having a desired shape and accurate dimensions.

Conventionally, this has been addressed by performing a process (closing process) in which a boundary line between plane element data elements is manually or automatically selected and closed by performing a merge process, or by performing a process which posits that all the generated plane element data elements are closed and automatically creates a closed solid model directly from all of the plane element data. Therefore, in some cases a shape of the generated three-dimensional model may differ greatly from the shape of the actual measured object, requiring significant amounts of time for subsequent correction work.

In order to resolve the above-noted situation, the present invention provides a three-dimensional model generating method, a three-dimensional model generating system, and a three-dimensional model generating program capable of readily generating a three-dimensional model having a desired shape and accurate dimensions based on measurement data.

SUMMARY OF THE INVENTION

A three-dimensional model generating method according to one aspect of the present invention utilizes a calculator generating a three-dimensional model based on measurement data, which includes measurement point group data obtained by measuring a measured object, a type of a plane element, and geometric values of the plane element. The calculator includes a three-dimensional model element generator generating a three-dimensional model element representing a shape of at least a portion of the three-dimensional model based on the measurement data using a predetermined method, the three-dimensional model element being defined by a plane element and a predetermined condition; and a three-dimensional model generator generating a three-dimensional model using one or a plurality of three-dimensional model elements. In addition, when generating the three-dimensional model, the calculator selects a predetermined plane element defining the three-dimensional model element from the measurement data; obtains a condition required to generate the three-dimensional model element; generates the three-dimensional model element using the selected plane element and the obtained condition; and generates the three-dimensional model of the measured object using one or a plurality of three-dimensional model elements.

In the three-dimensional model generating method according to this aspect, one or a plurality of three-dimensional model elements are generated by selecting an appropriate plane element included in the measurement data, and a three-dimensional model of the measured object is generated from the three-dimensional model elements. Accordingly, a user can readily generate a three-dimensional model having a desired shape and accurate dimensions based on the measurement data by performing an appropriate selection operation based on the shape of the measured object.

In another aspect of the present invention, the calculator is capable of representing a three-dimensional shape as the three-dimensional model element using a locus for a case where a predetermined flat planar shape is displaced in a predetermined direction, and of using a sweep base plane defining a flat plane occupied by a flat planar shape; a closed contour set defining a shape on the flat planar sweep base plane; and a sweep element defined by a direction and distance over which the flat planar shape is displaced. In addition, when generating the three-dimensional model, the calculator selects a predetermined plane element from the measurement data as the sweep base plane; selects a second appropriate plane element intersecting with the sweep base plane; generates a contour line using a line of intersection between the sweep base plane and the second plane element and generates a closed contour set using a plurality of contour lines and a plurality of points where the contour lines intersect with each other; obtains a direction and distance over which a sweep occurs as the condition; generates the sweep element using the selected sweep base plane, the generated closed contour set, and the obtained direction and distance over which the sweep occurs; and generates the three-dimensional model using one or a plurality of sweep elements.

According to this aspect, when generating the closed contour set for the three-dimensional model element, the calculator extracts a plane element intersecting with the sweep base plane from the measurement data and, in a case where the contour lines can be extrapolated, the calculator automatically generates the closed contour set, whereas in a case where the contour lines cannot be extrapolated, the calculator creates a list of plane elements intersecting with the sweep base plane. In addition, according to this aspect, when generating the closed contour set, in a case where points where a plurality of contour lines intersect with each other can be extrapolated, the calculator automatically generates the closed contour set, whereas in a case where the points where a plurality of contour lines intersect with each other cannot be extrapolated, the calculator creates a list of intersection points.

In another aspect of the present invention, the calculator is capable of representing a three-dimensional shape as a three-dimensional model element by slicing a given three-dimensional shape with a predetermined flat or curved plane, and of using a parent model element, which is the three-dimensional shape to be sliced; a cut base plane defining a slicing plane; and a cut element defined using a cut direction indicating a direction in which the element is erased after slicing. In addition, when generating the three-dimensional model, the calculator selects a predetermined plane element from the measurement data as the cut base plane; obtains the cut direction as the condition; generates the cut element using the parent model element, the selected cut base plane, and the cut direction; and generates the three-dimensional model using one or a plurality of the parent model elements and the cut elements.

In a case where the cut element is manipulated, when selecting the cut base plane, the calculator extracts the plane element intersecting with the parent model element from the measurement data and, in a case where there are a plurality of plane elements intersecting with the parent model element, the calculator creates a list of the plane elements intersecting with the parent model element, whereas in a case where only one plane element intersects with the parent model element, the calculator automatically selects the cut base plane. In such a case, when obtaining the cut direction, the calculator generates a three-dimensional image in which the parent model element, the cut base plane, and an image of an arrow or the like representing the cut direction overlap, and the cut direction is obtained based on input from the input device.

In addition, the calculator further includes a first three-dimensional model generator, which obtains from the plane elements information for intersections between plane elements and contour information for each plane element, and automatically generates a first three-dimensional model. Furthermore, when generating the three-dimensional model, the calculator automatically generates the first three-dimensional model, generates the three-dimensional model element, and corrects the first three-dimensional model using one or a plurality of the three-dimensional model elements.

In the three-dimensional model generating method of this kind, the first three-dimensional model is automatically generated by a first three-dimensional model generator of the calculator. The first three-dimensional model automatically generated in this way may, for example, have a shape that differs from that of the measured object in only one area. In some cases, such a difference in shape can be discovered comparatively easily by visual confirmation at this stage. Thus, the user can compare the shapes of the automatically generated first three-dimensional model and the measured object and correct the first three-dimensional model as appropriate using the three-dimensional model elements, and thus a second three-dimensional model can be readily generated having a desired shape and accurate dimensions based on the measurement data.

A three-dimensional model generating system according to another aspect of the present invention includes a calculator generating a three-dimensional model based on measurement data, which includes measurement point group data obtained by measuring a measured object, a type of a plane element, and geometric values of the plane element. The calculator includes a three-dimensional model element generator generating a three-dimensional model element representing a shape of at least a portion of the three-dimensional model based on the measurement data using a predetermined method, the three-dimensional model element being defined by a plane element and a predetermined condition; and a three-dimensional model generator generating a three-dimensional model using one or a plurality of three-dimensional model elements. In addition, when generating the three-dimensional model, the calculator selects a predetermined plane element defining the three-dimensional model element from the measurement data; obtains a condition required to generate the three-dimensional model element; generates the three-dimensional model element using the selected plane element and the obtained condition; and generates the three-dimensional model of the measured object using one or a plurality of three-dimensional model elements.

A three-dimensional model generating program according to another aspect of the present invention utilizes a calculator and generates a three-dimensional model based on measurement data, which includes measurement point group data obtained by measuring a measured object, a type of a plane element, and geometric values of the plane element. The three-dimensional model generating program includes a three-dimensional model element generator generating a three-dimensional model element representing a shape of at least a portion of the three-dimensional model based on the measurement data using a predetermined method, the three-dimensional model element being defined by a plane element and a predetermined condition; and a three-dimensional model generator generating a three-dimensional model using one or a plurality of three-dimensional model elements. In addition, the three-dimensional model generating program causes the calculator, when generating the three-dimensional model, to execute a step of selecting a predetermined plane element defining the three-dimensional model element from the measurement data; a step of obtaining a condition required to generate the three-dimensional model element; a step of generating the three-dimensional model element using the selected plane element and the obtained condition; and a step of generating the three-dimensional model of the measured object using one or a plurality of three-dimensional model elements.

According to the present invention, a three-dimensional model can be readily generated having a desired shape and accurate dimensions based on measurement data.

BRIEF DESCRIPTION OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

DETAILED DESCRIPTION OF THE INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the forms of the present invention may be embodied in practice.

Embodiments of the present invention are described in detail below with reference to the drawings.

First Embodiment

Figure 1:
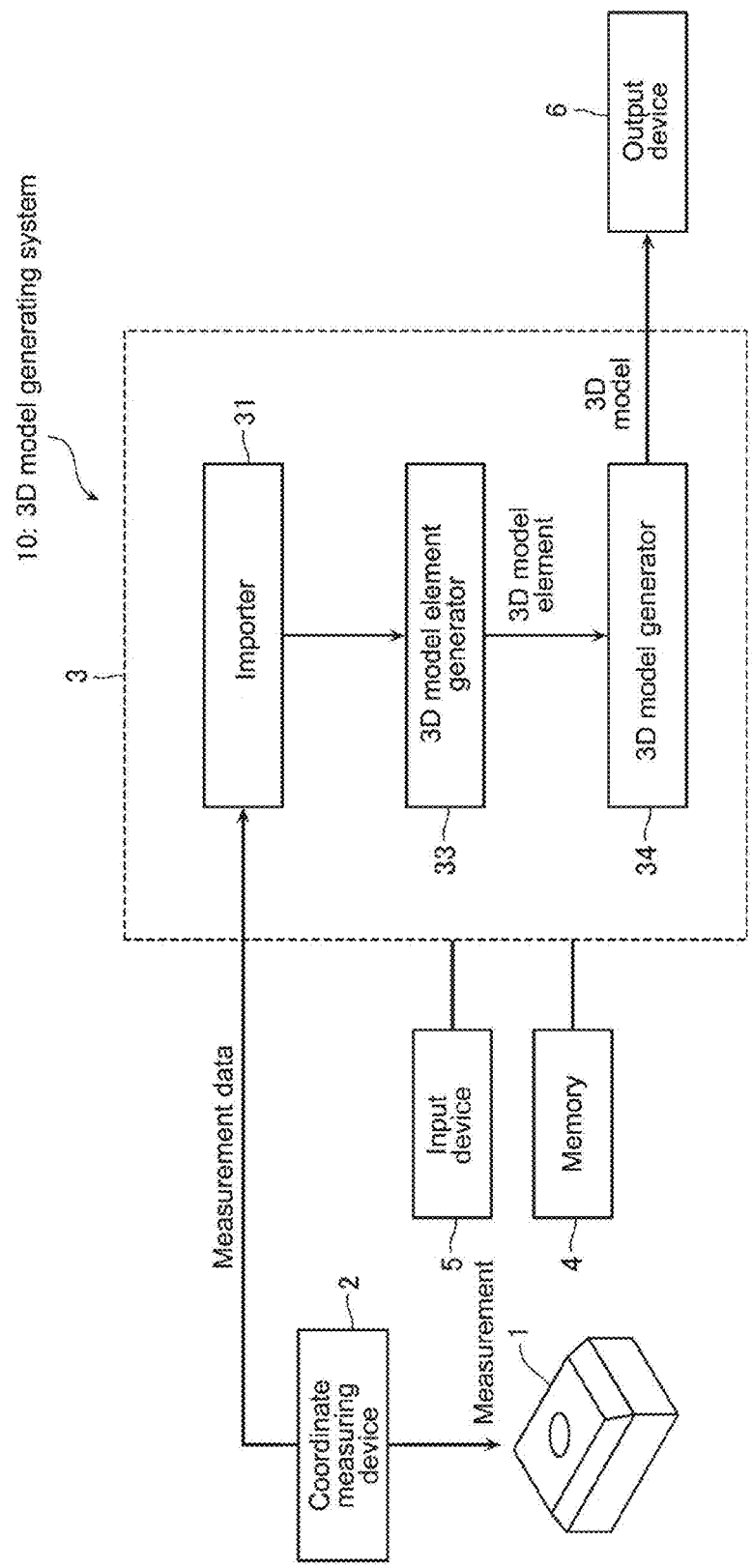
FIG. 1 is a block diagram of a three-dimensional model generating system according to a first embodiment of the present invention.

FIG. 1 is a block diagram of a three-dimensional model generating system 10 according to the present embodiment.

The three-dimensional model generating system 10 according to the present embodiment obtains measurement data from a coordinate measuring device 2, which measures a measured object 1, and generates a three-dimensional model based on CAD data, for example. The three-dimensional model generating system 10 constitutes a portion of a CAD system, for example. In the present embodiment, a solid model is generated as the three-dimensional model; however, the three-dimensional model is not limited to a solid model and may also be generated as a surface model or a wire model.

As shown in FIG. 1, the three-dimensional model generating system 10 achieves various functions using a computer apparatus and a three-dimensional model generating program executed by the computer apparatus. The computer apparatus is configured to include a calculator 3, which generates the three-dimensional model based on the measurement data obtained by measuring the measured object 1; a memory 4 connected to the calculator 3 and storing the three-dimensional model generating program; an input device 5 connected to the calculator 3 and operating the three-dimensional model generating program according to the present embodiment, performing input of various parameters, and the like; and an output device 6 outputting the three-dimensional model generated by the calculator 3. The calculator 3 is a CPU or microprocessor, for example, and performs various calculations. A keyboard, mouse, touchscreen panel, or the like may be employed as the input device 5, and a display screen, projector, printer, or the like may be employed as the output device 6.

As shown in FIG. 1, the calculator 3 includes various features in addition to a predetermined three-dimensional model generating program, such as an importer 31 obtaining the measurement data from the coordinate measuring device 2; a three-dimensional model element generator 33 generating a three-dimensional model element that represents, using a predetermined method, a shape of at least a portion of a three-dimensional model based on the measurement data obtained by the importer 31; and a three-dimensional model generator 34 generating a three-dimensional model using one or a plurality of the three-dimensional model elements.

As shown in FIG. 1, an object having any shape, including a free-form surface, may be selected as the measured object 1; however, an object having a surface shape that can be defined by a CAD system as an analytic quadric surface is preferred. In other words, the surface shape of the measured object 1 may be configured by a combination of any of, for example, a point element; a straight line element; a curved line element such as a circle or ellipse; and a plane element such as a flat plane, a cylindrical plane, a conical plane, a spherical plane, or a toroid plane. Here, as shown in FIG. 1, an example is posited having substantially a box (parallelepiped) shape with the four sides of a top surface tapered, and a cylindrical through-hole running through the top and bottom surfaces.

The measurement data output from the coordinate measuring device 2 includes measurement point group data, types of geometric elements, and geometric values of the geometric elements. The measurement point group data is a data set of measured coordinates of one or a plurality of measurement points of a surface of the measured object 1. The type of geometric element is data indicating a category such as a point element, a straight line element, and a plane element for, e.g., a point, a straight line, a flat surface, a circle, an ellipse, a cylindrical surface, a conical surface, a spherical surface, or a toroid surface. The type of geometric element may also be data obtained by an operator providing individual instructions when measurement point group data is obtained during coordinate measurement, or may be data obtained by an automatic determination by a coordinate measuring device in response to a distribution status of measurement point group data (see, for example, Japanese Patent Laid-open Publication No. 2001-241941). In addition, the geometric value of the geometric element is data such as reference position coordinates, orientation, length, or diameter of the geometric element, as estimated from the measurement point group data. For example, the geometric values may include, in the case of a straight line element, coordinate values of a reference point, direction, and length; in the case of a flat plane element, coordinate values of a reference point and normal direction; in the case of a circle element, coordinate values of a reference point, a normal direction, and a diameter; and in the case of an ellipse element, coordinate values of a reference point, a normal direction, a major axis direction, a major axis, and a minor axis. The geometric value of the geometric element is found using the type of geometric element and the measurement point group data. For ease of description in the following, the geometric element is a plane element. Furthermore, the measurement data may also include data related to a direction in which the plane element is obtained (direction in which the measured object 1 lies relative to the plane element), such as a probe contact direction or an image capture direction, for example.

Figure 2:
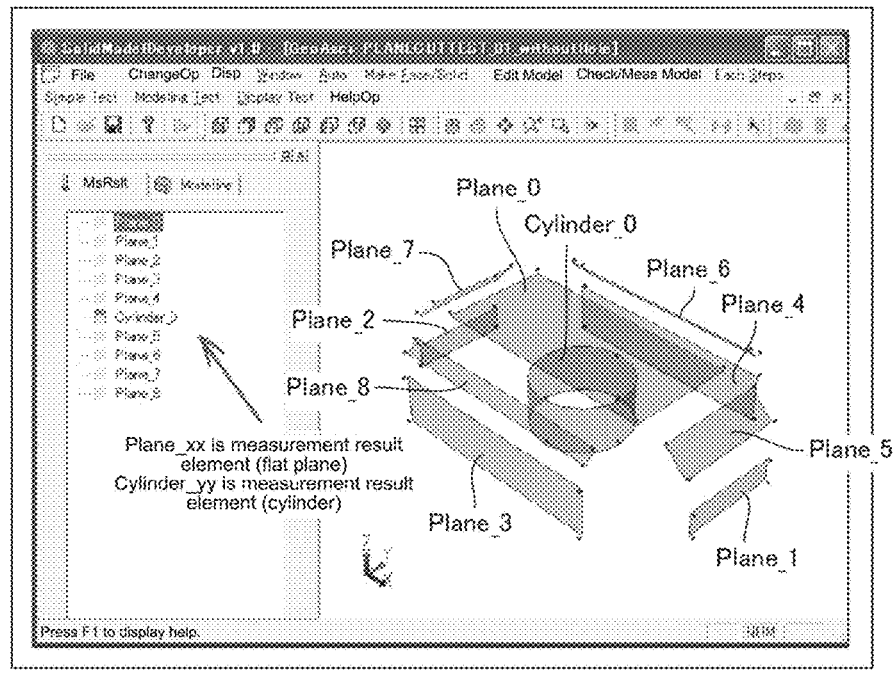
FIG. 2 illustrates an exemplary graphic output to an output device.

FIG. 2 illustrates an exemplary graphic that is output to the output device 6 and depicts, on the left portion of the figure, the list (feature tree) of plane elements included in the measurement data and, on the right portion of the figure, a shape represented by the plane elements. In the example shown in FIG. 2, the plane elements in the measurement data are flat plane elements Plane_0 to Plane_8 and a cylindrical plane element Cylinder_0. The flat plane elements Plane_0 to Plane_8 are plane elements obtained when each flat plane of the measured object 1 is measured. The cylindrical plane element Cylinder_0 is a plane element obtained when the through-hole running through the top and bottom surfaces of the measured object 1 is measured. Moreover, as shown in FIG. 2, a breadth (length, width, height, and the like) of each plane element is indeterminate in the measurement data. In this example, the breadth is expressed based on a distribution range of the measurement point group.

Figure 3:
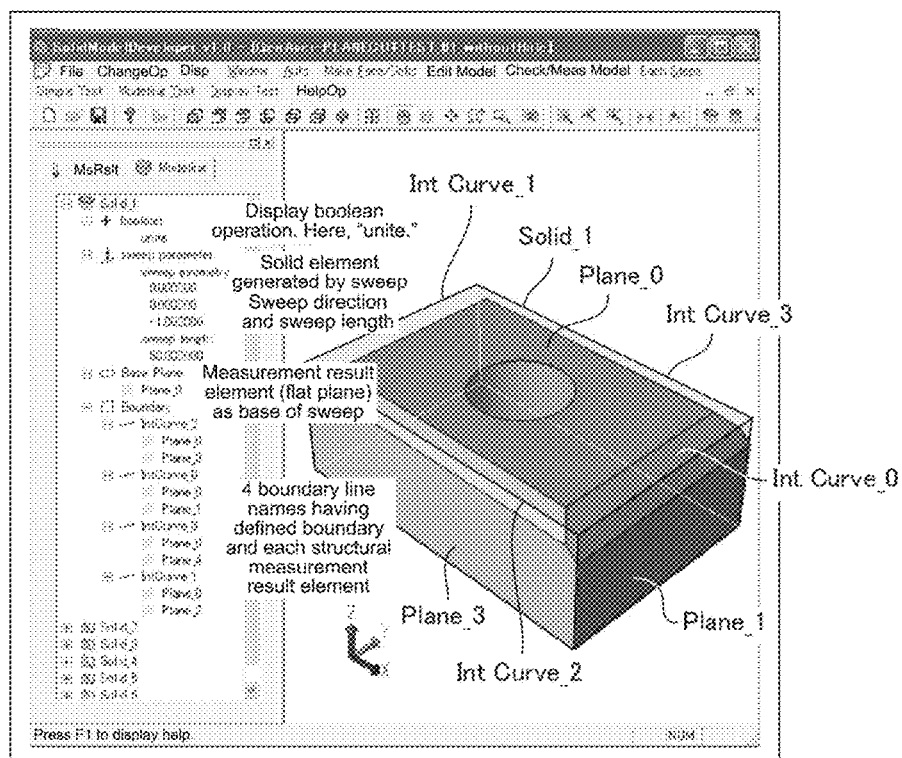
FIG. 3 illustrates another exemplary graphic output to the output device.

FIG. 3 illustrates another exemplary graphic output to the output device 6 and, on the right portion of the figure, depicts the generated three-dimensional model and one (Solid_1) of the plurality of three-dimensional model elements generating the three-dimensional model. Moreover, a list (feature tree) is shown on the left portion of the figure listing the three-dimensional model elements configuring the three-dimensional model, the plane elements defining the three-dimensional model elements, and parameters.

As shown in FIG. 3, in the present embodiment, the three-dimensional model is generated by combining a plurality of three-dimensional model elements. As noted above, the three-dimensional model elements represent a shape of at least a portion of the three-dimensional model, and are defined by plane elements included in measured elements and by predetermined parameters. In addition, the three-dimensional model elements include a plurality of types of elements, depending on a representation method of the three-dimensional model. FIG. 3 illustrates a sweep element Solid_1. A sweep element represents a three-dimensional shape using a locus for a case where a predetermined flat planar shape is displaced in a predetermined direction. As shown on the left in FIG. 3, the sweep element may be expressed by, for example, a sweep base plane defining a plane occupied by the flat planar shape; a closed contour set (boundary) defining a shape of the flat planar shape on the sweep base plane; a direction (sweep geometry) in which the flat planar shape is displaced; and a distance (sweep length) over which the sweep occurs.

As shown in FIG. 3, in the present embodiment, the sweep base plane is selected from the plane elements included in the measurement data. In addition, the closed contour set (boundary) is expressed by a plurality of contour lines (IntCurve_0 to IntCurve_3) and intersection points, and the contour lines are expressed by lines of intersection between the plane elements included in the measurement data.

As shown in FIG. 3, other parameters may also exist as parameters defining the sweep element. In the present embodiment, a Boolean operation element (boolean) is provided as such a parameter. For example, as shown in FIG. 3, in a case where Boolean operation elements are united, the three-dimensional model is created in a space defined by the sweep base plane, the closed contour set, the direction in which the sweep occurs, and the distance over which the sweep occurs. Meanwhile, in a case where the Boolean operation elements are subtracted, the three-dimensional model is not created at a portion overlapping with the space occupied by the other three-dimensional model elements.

Figure 4:
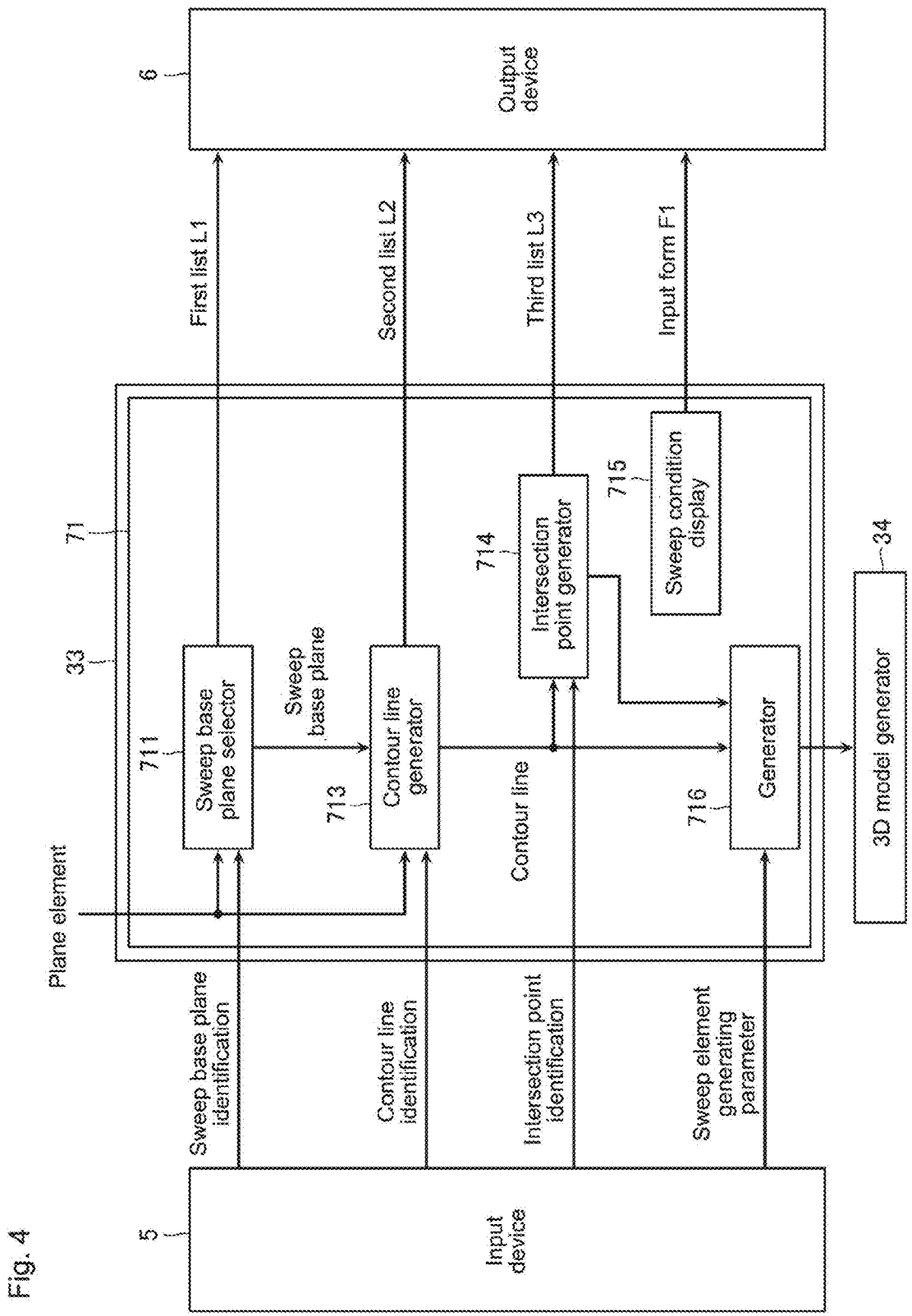
FIG. 4 is a block diagram of a configuration of a three-dimensional model element generator according to the first embodiment of the present invention.

Next, a sweep element generator 71 within the three-dimensional model element generator 33 according to the present embodiment is described with reference to FIG. 4. FIG. 4 is a block diagram illustrating a portion of a configuration of the three-dimensional model element generator 33 according to the present embodiment. As shown in FIG. 4, the three-dimensional model element generator 33 according to the present embodiment includes the sweep element generator 71 generating sweep elements.

Within the sweep element generator 71, a sweep base plane selector 711 selects a plane element in the measurement data as the sweep base plane. The sweep base plane selector 711 also creates a list (first list) L1 of candidate flat plane elements for the sweep base plane from the measurement data and outputs the list to the output device 6, then selects the sweep base plane in accordance with input from the input device 5.

Within the sweep element generator 71, a contour line generator 713 selects, from the plane elements in the measurement data, the selected sweep base plane as well as a second plane element defining the contour line and generates the contour line using the line of intersection between the sweep base plane and the second plane element. The contour line generator 713 also creates a list (second list) L2 of lines of intersection between the sweep base plane and second plane elements and outputs the list to the output device 6, then selects the contour lines sequentially in accordance with input from the input device 5.

Within the sweep element generator 71, an intersection point generator 714 generates an intersection point defining a contour of a closed contour set based on a point of intersection between contour lines. The intersection point generator 714 also creates a list (third list) L3 of intersection points defining the contour of the closed contour set and outputs the list to the output device 6, then selects the intersection points sequentially in accordance with input from the input device 5.

Within the sweep element generator 71, a sweep condition display 715 displays, on the output device 6, conditions required to generate a sweep element. The sweep condition display 715 may also output, to the output device 6, an input form F1 to which conditions required to generate a sweep element are input, and sequentially obtain the sweep element generation parameters in accordance with input from the input device 5.

Within the sweep element generator 71, a generator 716 generates a sweep element using the generated contour lines, intersection points, and sweep element generating parameters that are input using the input device 5.

Figure 5:
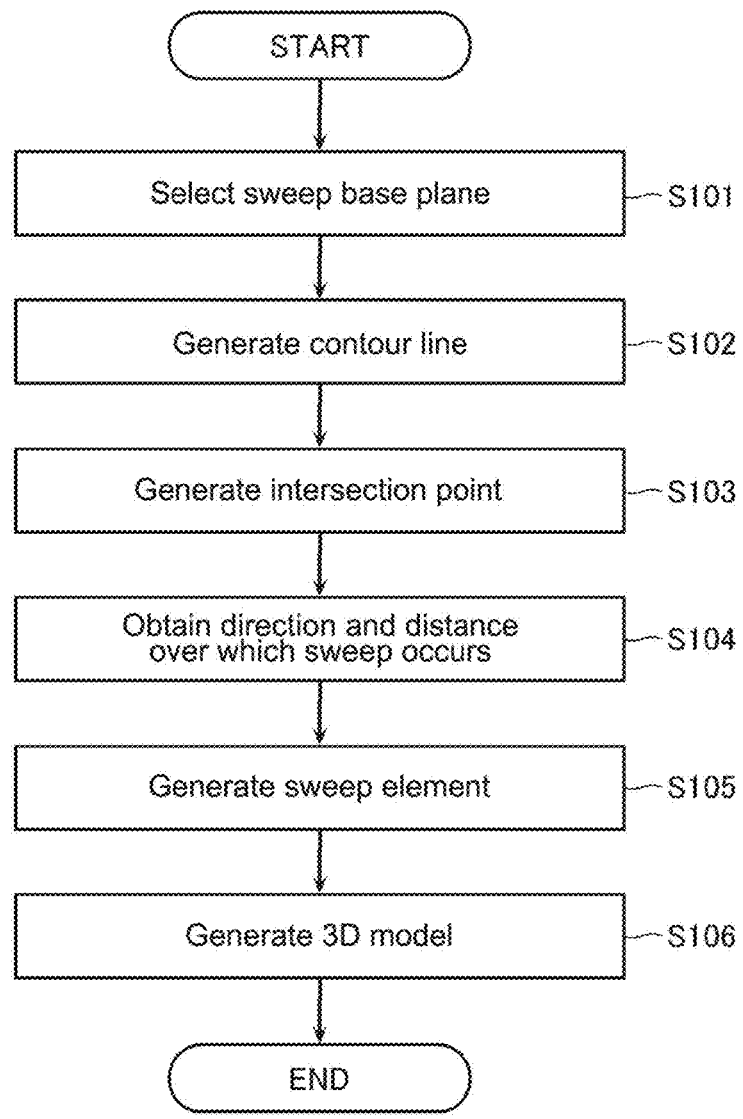
FIG. 5 is a flowchart illustrating the three-dimensional model generating method according to the first embodiment of the present invention.
Figure 6:
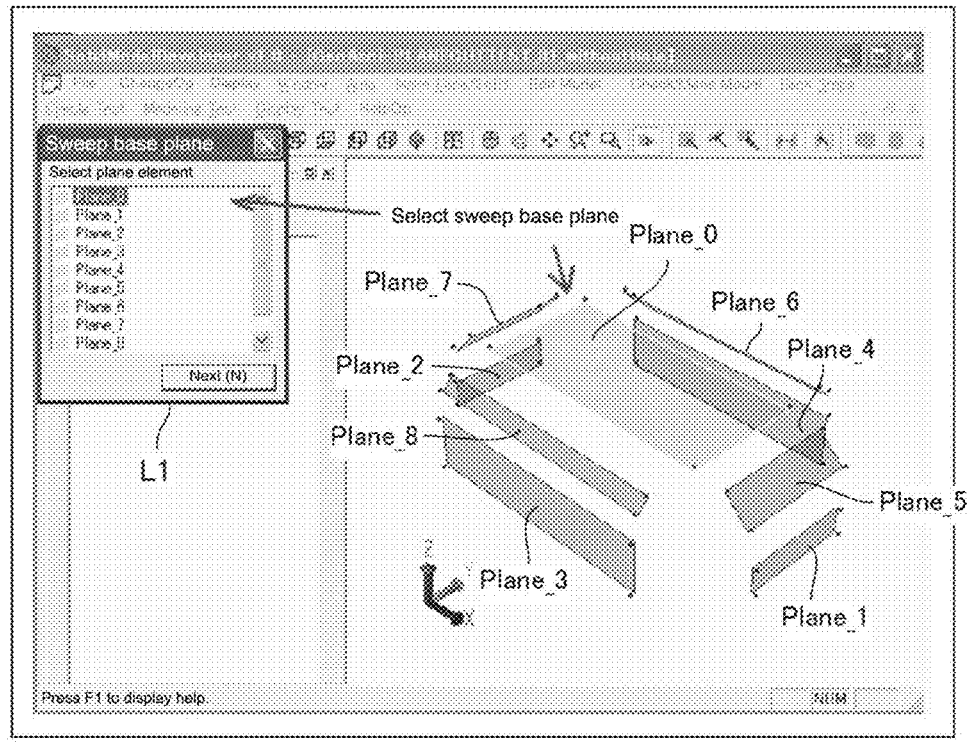
FIG. 6 illustrates another exemplary graphic output to the output device.
Figure 7:
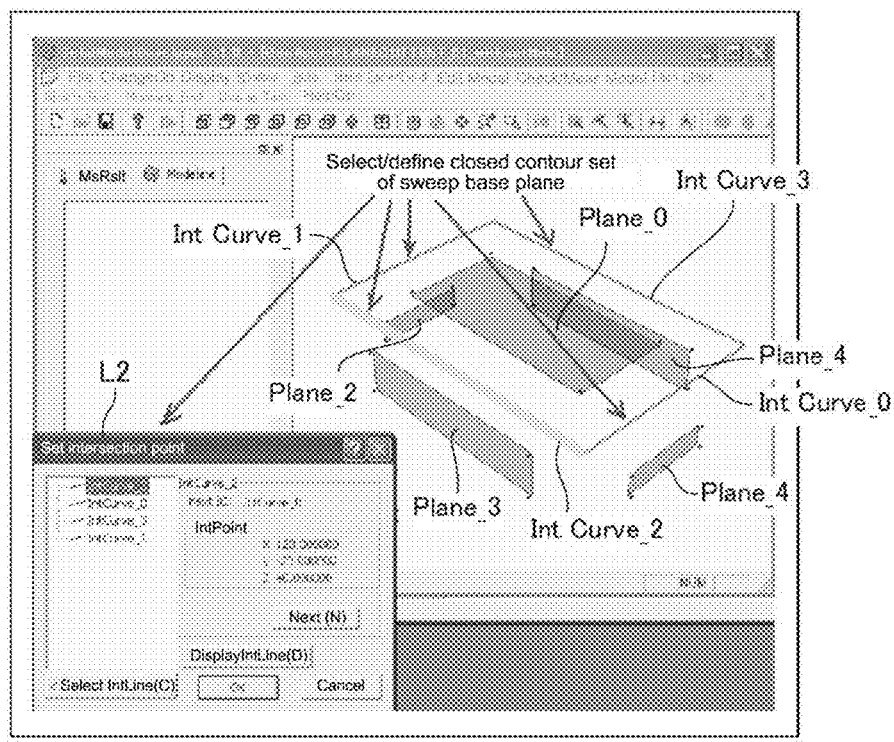
FIG. 7 illustrates another exemplary graphic output to the output device.
Figure 8:
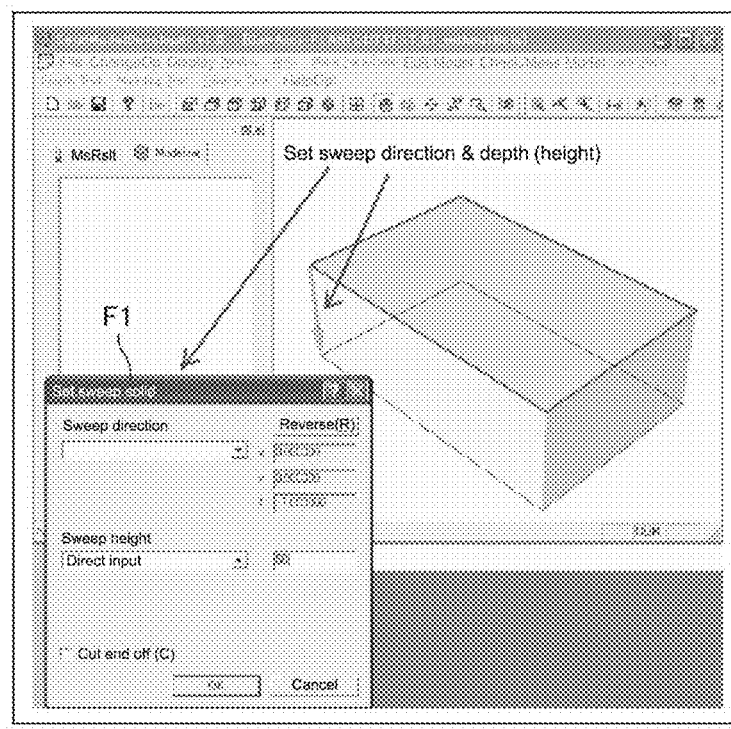
FIG. 8 illustrates another exemplary graphic output to the output device.

Next, the three-dimensional model generating method according to the present embodiment is described with reference to FIGS. 5 to 8. FIG. 5 is a flowchart illustrating the three-dimensional model generating method according to the present embodiment. FIGS. 6 to 8 illustrate exemplary graphics output to the output device 6 when generating the three-dimensional model.

As shown in FIG. 5, in step S101, a predetermined plane element in the measurement data is selected as the sweep base plane. At that point, as shown in FIG. 6, the list (first list) L1 of candidate flat plane elements for the sweep base plane may also be created and output to the output device 6, then the sweep base plane may be selected in accordance with input from the input device 5. In addition, as shown in FIG. 6, a three-dimensional image of the flat plane elements in the list may also be displayed.

As shown in FIG. 5, in step S102, the other plane elements are selected from the measurement data and the contour lines are generated. At that point, as shown in FIG. 7, the list (second list) L2 of lines of intersection between the sweep base plane and other plane elements may also be created and output to the output device 6, then the contour lines may be selected sequentially in accordance with input from the input device 5. In addition, as shown in FIG. 7, a three-dimensional image may also be displayed of the flat plane elements serving as a foundation for generating the contour lines.

As shown in FIG. 5, in step S103, an intersection point is generated which defines a contour of a closed contour set based on a point of intersection between generated contour lines. At this point, the list (third list) L3 of intersection points defining the contour of the closed contour set may also be created and output to the output device 6, then the intersection points may be selected sequentially in accordance with input from the input device 5.

As shown in FIG. 5, in step S104, a direction and distance over which a sweep occurs are obtained. At this point, as shown in FIG. 8, an input form Fl to which conditions required to generate a sweep element are input may also be output to the output device 6, and the direction and distance (height of the sweep) over which the sweep occurs may be obtained in accordance with input from the input device 5. In addition, as shown in FIG. 8, a three-dimensional image may also be displayed illustrating the generated closed contour set and the direction and distance over which the sweep occurs. Moreover, the distance over which the sweep occurs can also be input by selection of a specified plane to serve as a range.

As shown in FIG. 5, in step S105, the sweep element is generated using the selected sweep base plane, the generated closed contour set, and the obtained direction and distance over which the sweep occurs. Thereby, the sweep element Solid_1 as shown in FIG. 3 is generated, for example.

As shown in FIG. 5, in step S106, the three-dimensional model is generated using the generated sweep element. In the example shown in FIG. 3, Solid_1 to Solid_6 are combined to generate the three-dimensional model. In this example, Solid_2 to Solid_6 may also generate sweep elements by displacing the flat plane elements Plane_5 to Plane_8, which correspond to the tapered portions of the measured object 1, in a vertical direction (Z direction in the drawings), and generate the three-dimensional model by setting the Boolean described above to "subtract." The three-dimensional model may also be generated using only one or a plurality of sweep elements, or may be generated by combination with other three-dimensional model elements.

In the three-dimensional model generating method according to the present embodiment, one or a plurality of three-dimensional model elements are generated by selecting an appropriate plane element included in the measurement data, and a three-dimensional model of the measured object is generated from the three-dimensional model elements. Accordingly, a user can readily generate a three-dimensional model having a desired shape and accurate dimensions based on the measurement data by performing an appropriate selection operation based on the shape of the measured object.

In addition, the sweep element is represented using the sweep base plane, the closed contour set, and the direction and distance over which the sweep occurs. Accordingly, correction and editing are facilitated as compared to a three-dimensional model represented by plane element data or the like.

Second Embodiment

Figure 9:
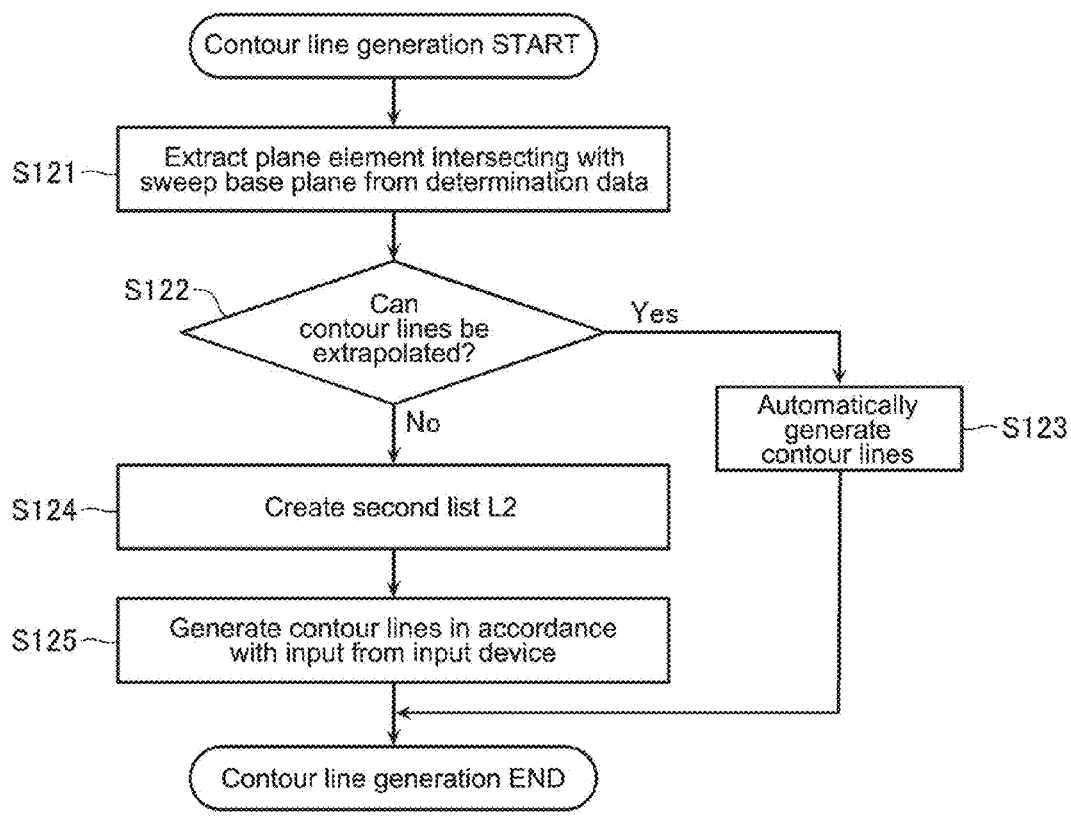
FIG. 9 is a flowchart illustrating a three-dimensional model generating method according to a second embodiment of the present invention.

Next, a three-dimensional model generating method according to a second embodiment of the present invention is described with reference to FIG. 9. FIG. 9 is a flowchart illustrating the three-dimensional model generating method according to the present embodiment.

The three-dimensional model generating method according to the present embodiment is performed in a manner basically similar to the method of the first embodiment. However, in the present embodiment, a step where the contour lines are generated (shown in step S102 in FIG. 5) differs from that of the first embodiment. Specifically, in the present embodiment, as shown in FIG. 9, when generating the closed contour set, the plane elements intersecting with the sweep base plane are extracted from the measurement data (step S121) and a decision is made as to whether the contour lines can be extrapolated (step S122). When the contour lines can be extrapolated, the closed contour set is automatically generated (step S123). On the other hand, when the contour lines cannot be extrapolated, the second list L2 as described above is created (step S124), and the contour lines are generated in accordance with an input operation from the input device 5 (step S125).

The contour lines can be extrapolated in cases where, for example, the plane elements intersecting with the sweep base plane include only two groups of mutually parallel flat plane elements (total of four plane elements); include only three flat plane elements generating contour lines of different angles; or include only a cylindrical plane, a conical plane, or a spherical plane. In addition, candidate plane elements can also be narrowed down by considering, for example, a direction in which the plane element was obtained during measurement with the coordinate measuring device 2 (e.g., a probe contact direction). In such a case, when the contour lines cannot be extrapolated, narrowed results may also be reflected on the second list L2. Moreover, in a case where, by selecting a certain contour line from the second list L2, the remaining contour lines can then be extrapolated, the closed contour set may be generated automatically.

In the three-dimensional model generating method according to the present embodiment, when the contour lines can be extrapolated, the closed contour set is automatically generated. Thus, a three-dimensional model can be more readily generated. In addition, mistaken selection of an inappropriate plane element can be avoided.

In addition, in the three-dimensional model generating method according to the present embodiment, when the contour lines cannot be extrapolated, the second list L2 as described above is created. Accordingly, even when the measured object 1 has an extremely complex shape, for example, the appropriate plane element can be more readily selected.

Third Embodiment

Figure 10:
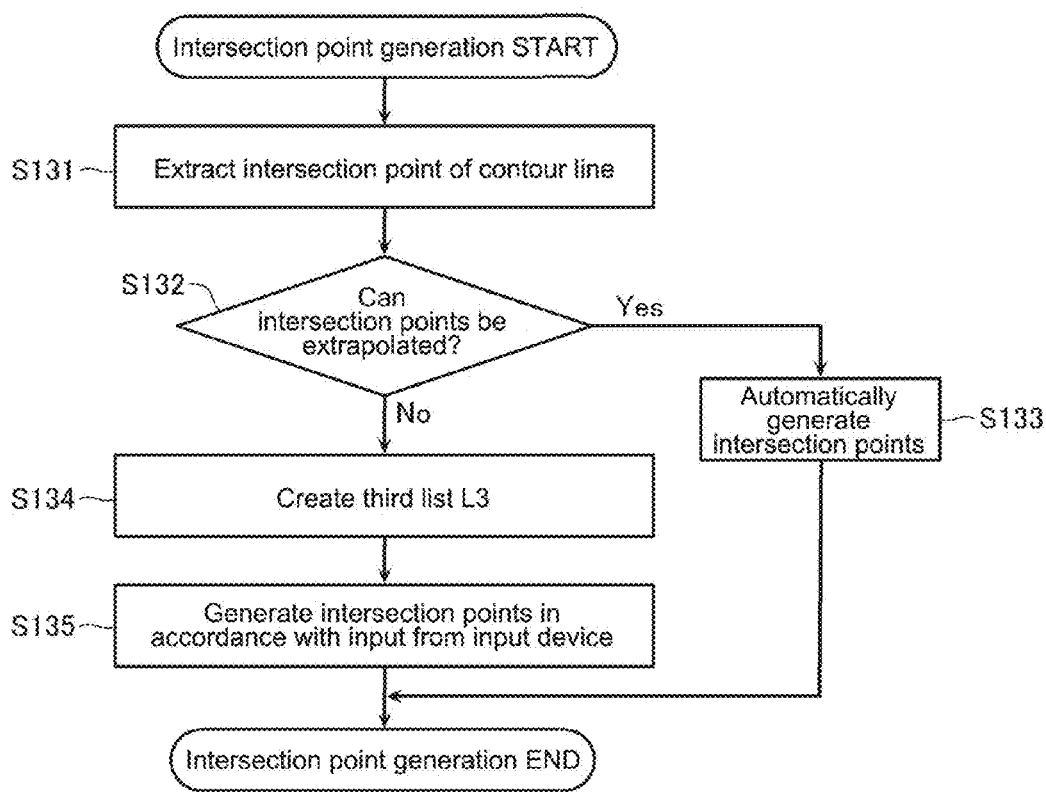
FIG. 10 is a flowchart illustrating the three-dimensional model generating method according to the second embodiment of the present invention.

Next, a three-dimensional model generating method according to a third embodiment of the present invention is described with reference to FIG. 10. FIG. 10 is a flowchart illustrating the three-dimensional model generating method according to the present embodiment.

The three-dimensional model generating method according to the present embodiment is performed in a manner basically similar to the methods of the first or second embodiments. However, in the present embodiment, a step where the intersection points are generated (shown in step S103 in FIG. 5) differs from that of the first or second embodiments. Specifically, in the present embodiment, as shown in FIG. 10, when generating the closed contour set, the intersection point with the contour lines is extracted (step S131) and a decision is made as to whether the intersection points can be extrapolated (step S132). When the intersection points can be determined generally, the intersection points are automatically generated (step S133). On the other hand, when the intersection points cannot be extrapolated, the third list L3 as described above is created (step S134), and the intersection points are generated in accordance with an input operation from the input device 5 (step S135).

In the three-dimensional model generating method according to the present embodiment, when the intersection points can be extrapolated, the closed contour set is automatically generated. Thus, a three-dimensional model can be more readily generated.

In addition, in the three-dimensional model generating method according to the present embodiment, when the intersection points cannot be extrapolated, the third list L3 as described above is created. Accordingly, even when the measured object 1 has an extremely complex shape, for example, the appropriate plane element can be more readily selected.

Fourth Embodiment

Figure 11:
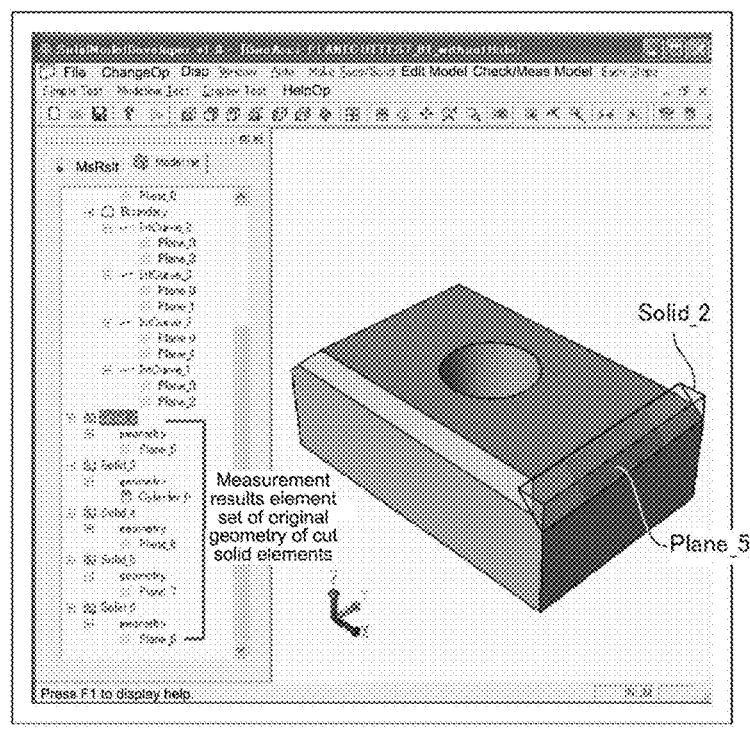
FIG. 11 illustrates another exemplary graphic output to the output device.

Next, a three-dimensional model generating method according to a fourth embodiment of the present invention is described with reference to FIGS. 11 to 17. FIG. 11 illustrates another exemplary graphic output to the output device 6 with the three-dimensional model generating method according to the fourth embodiment of the present invention, and depicts, on the right portion of the figure, the generated three-dimensional model and one of the three-dimensional model elements (here, Solid_2) generating the three-dimensional model. Moreover, a list (feature tree) is shown on the left portion of the figure listing the three-dimensional model elements configuring the three-dimensional model, the plane elements defining the three-dimensional model elements, and parameters. In the following description, portions similar to those of the first through third embodiments are assigned the same reference numerals, and a description thereof is omitted.

As was described with reference to FIG. 3, an exemplary case was provided for the first to third embodiments in which a sweep element is used as the three-dimensional model element. As shown in FIG. 11, in the present embodiment, a cut element is used in addition to the sweep element as the three-dimensional model element. The cut element represents a three-dimensional shape by slicing a given three-dimensional shape with a predetermined flat or curved plane. Furthermore, the cut element is expressed by, for example, a parent model element (the three-dimensional shape to be sliced), a cut base plane (geometry) defining a slicing plane of the parent model element, and a cut direction indicating a direction in which the three-dimensional shape is removed after slicing.

As shown in FIG. 11, in the present embodiment, the cut base plane is selected from the plane elements included in the measurement data. In addition, the parent model element may also be a sweep element generated by the sweep element generator 71, for example. In the example shown in FIG. 11, the Solid_1 shown in FIG. 3 is selected as a parent model and a plane element Plane_5 is selected as the cut base plane, thereby generating the cut element Solid_2.

Figure 12:
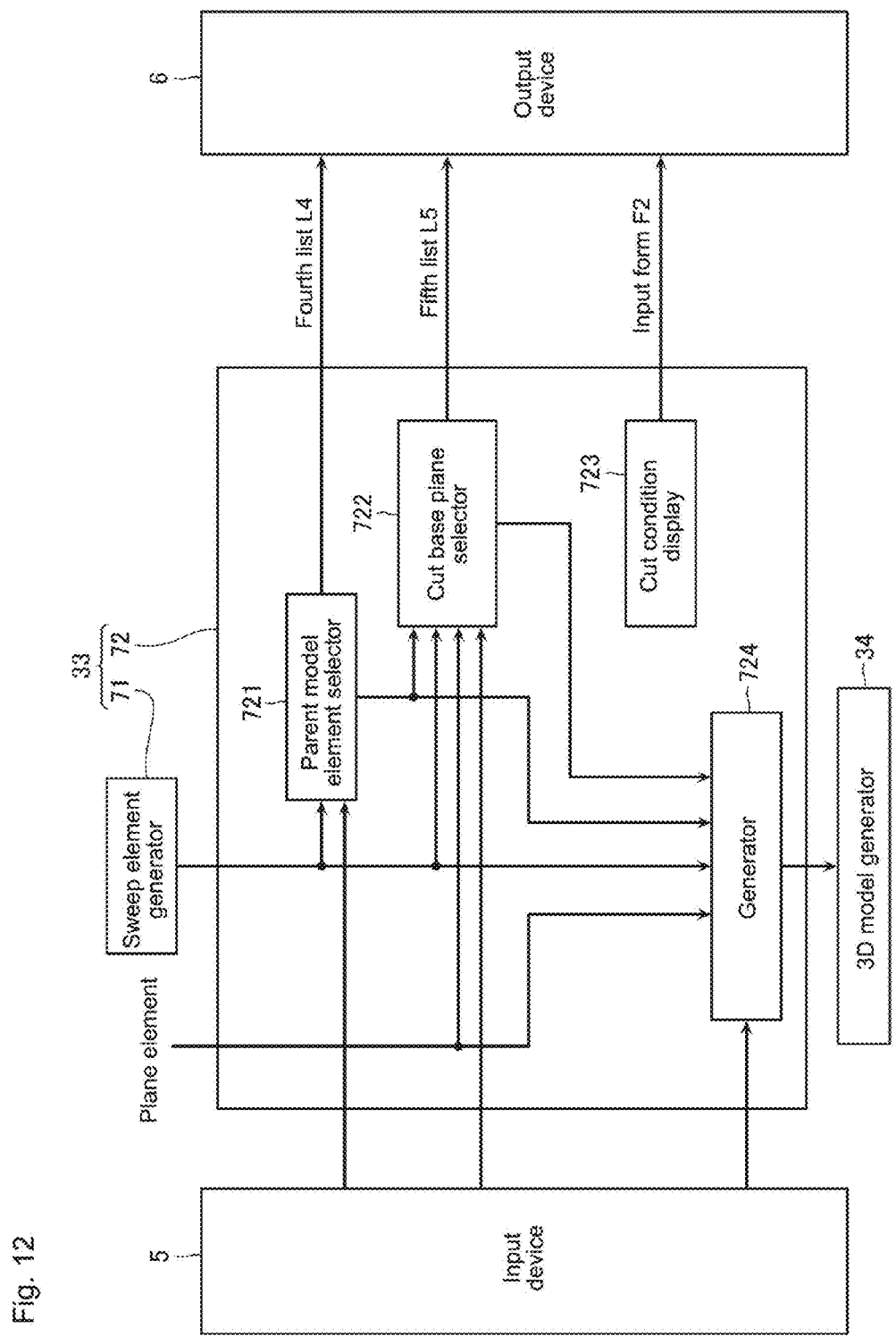
FIG. 12 is a block diagram of a configuration of a three-dimensional model element generator according to the second embodiment of the present invention.

Next, a three-dimensional model element generator 33 according to the present embodiment is described with reference to FIG. 12. FIG. 12 is a block diagram illustrating a configuration of the three-dimensional model element generator 33 according to the present embodiment. As shown in FIG. 12, the three-dimensional model element generator 33 according to the present embodiment includes the sweep element generator 71 as well as a cut element generator 72 generating cut elements.

Within the cut element generator 72, a parent model element selector 721 selects a sweep element generated by the sweep element generator 71 as the parent model element. The parent model element selector 721 creates a list (fourth list) L4 of candidate sweep elements for the parent model element and outputs the list to the output device 6, then selects the parent model element in accordance with input from the input device 5.

Within the cut element generator 72, a cut base plane selector 722 selects, from among the plane elements in the measurement data, a plane element that intersects with the selected parent model element as a cut base plane. The cut base plane selector 722 creates a list (fifth list) L5 of candidate plane elements for the cut base plane and outputs the list to the output device 6, then selects the cut base plane in accordance with input from the input device 5.

Within the cut element generator 72, a cut condition display 723 displays, on the output device 6, conditions required to generate a cut element. For example, the cut condition display 723 creates and outputs to the output device 6 an input form F2 in which the cut direction is designated, and obtains the cut direction based on input from the input device 5.

Within the cut element generator 72, a generator 724 generates a cut element using the selected parent model element, the cut base plane, and cut element generating parameters that are input using the input device 5.

Figure 13:
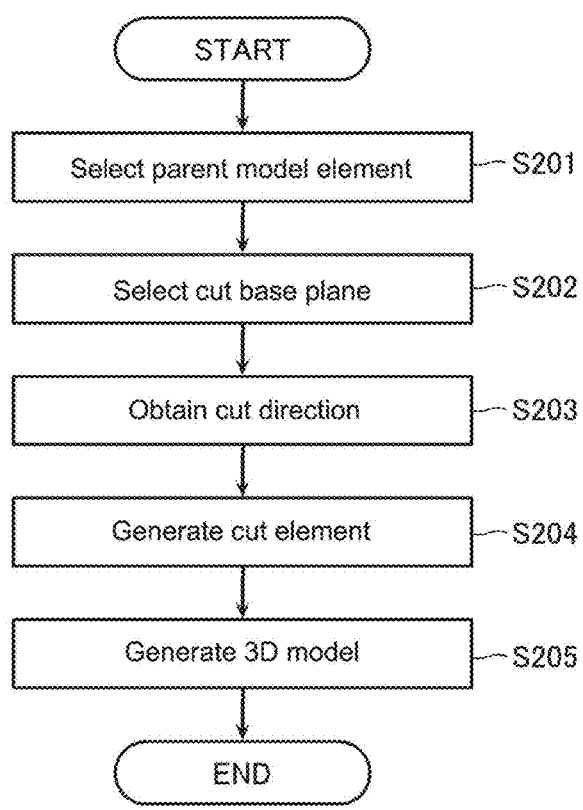
FIG. 13 is a flowchart illustrating the three-dimensional model generating method according to the second embodiment of the present invention.

Next, the three-dimensional model generating method according to the present embodiment is described with reference to FIGS. 13 to 17. FIG. 13 is a flowchart illustrating the three-dimensional model generating method according to the present embodiment. FIGS. 14 to 17 illustrate exemplary graphics output to the output device 6 when generating the three-dimensional model.

As shown in FIG. 13, in step S201, a sweep element generated by the sweep element generator 71 is selected as the parent model element. At that point, the list (fourth list) L4 of candidate sweep elements for the parent model element may also be created and output to the output device 6, then the parent model element may be selected in accordance with input from the input device 5. In a case where there is only one sweep element that is a candidate for the parent model element, this step may be omitted.

Figure 14:
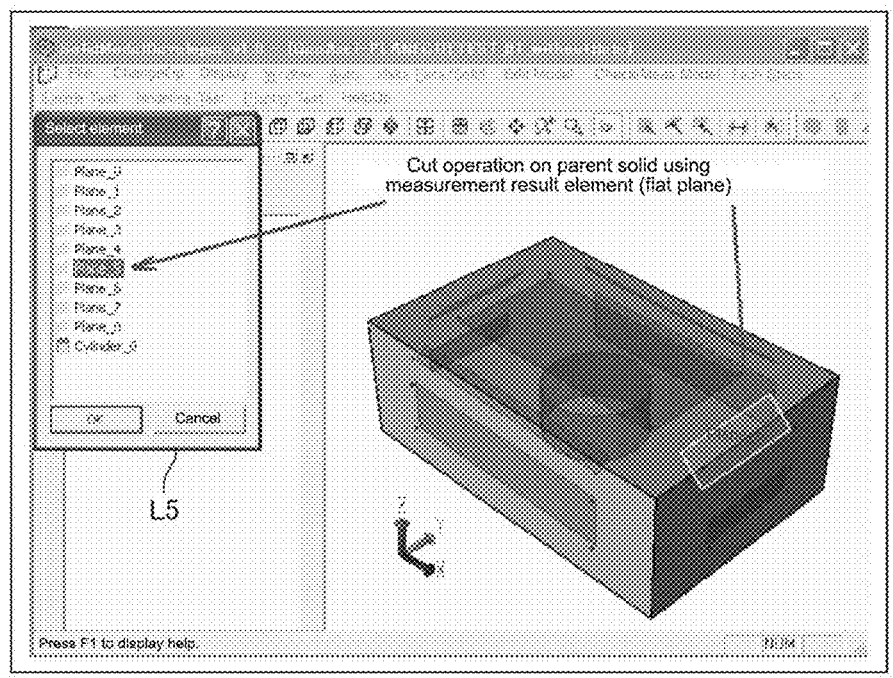
FIG. 14 illustrates another exemplary graphic output to the output device.

As shown in FIG. 13, in step S202, a plane element intersecting with the selected parent model element is selected from among the plane elements in the measurement data as the cut base plane. At this point, as shown in FIG. 14, the list (fifth list) L5 of candidate plane elements for the cut base plane may also be created and output to the output device 6, then the cut base plane may be selected in accordance with input from the input device 5. In addition, a three-dimensional image of the parent model element and the plane elements in the list may also be displayed.

Figure 15:
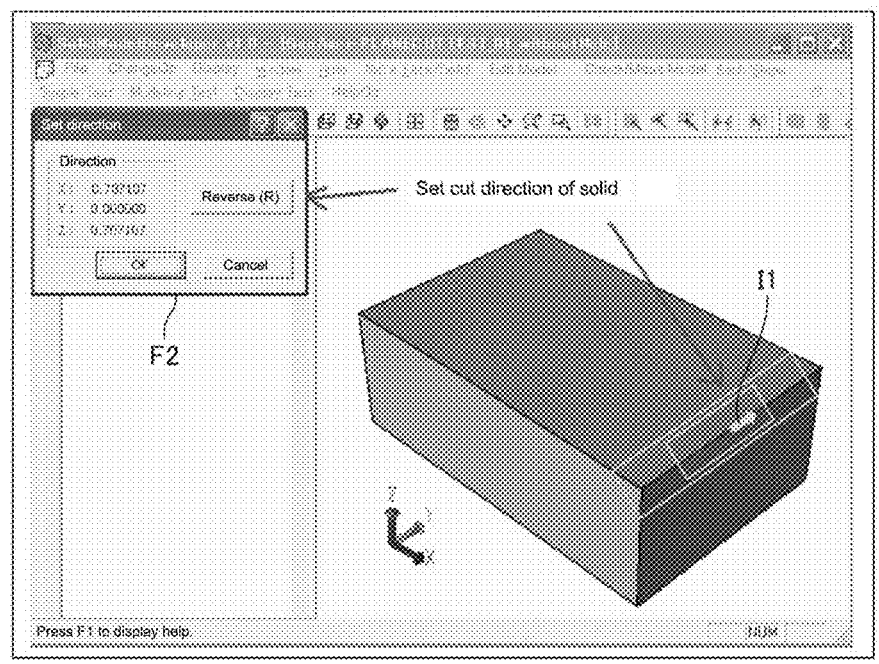
FIG. 15 illustrates another exemplary graphic output to the output device.

As shown in FIG. 13, in step S203, the cut direction is obtained. At this point, as shown in FIG. 15, a three-dimensional image may be generated in which the parent model element, the cut base plane, and an image I1 of an arrow or the like representing the cut direction overlap, and the three-dimensional image may be output to the output device 6 together with the input form F2 designating the cut direction, and the cut direction may be obtained based on input from the input device 5. In FIG. 15, the image I1 is an arrow indicating a direction perpendicular to the cut base plane. In addition, in the present embodiment, an orientation of the arrow can be reversed by selecting a reverse direction button provided in the input form F2, and the cut direction, which indicates the direction in which the element is to be erased after slicing, can be visually ascertained.

Figure 16:
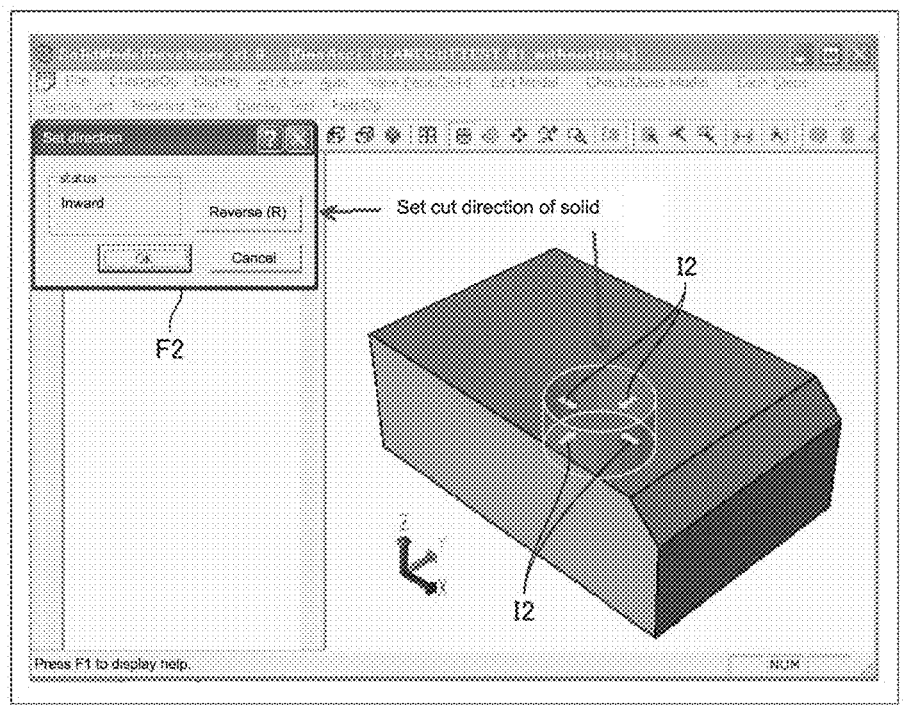
FIG. 16 illustrates another exemplary graphic output to the output device.
Figure 17:
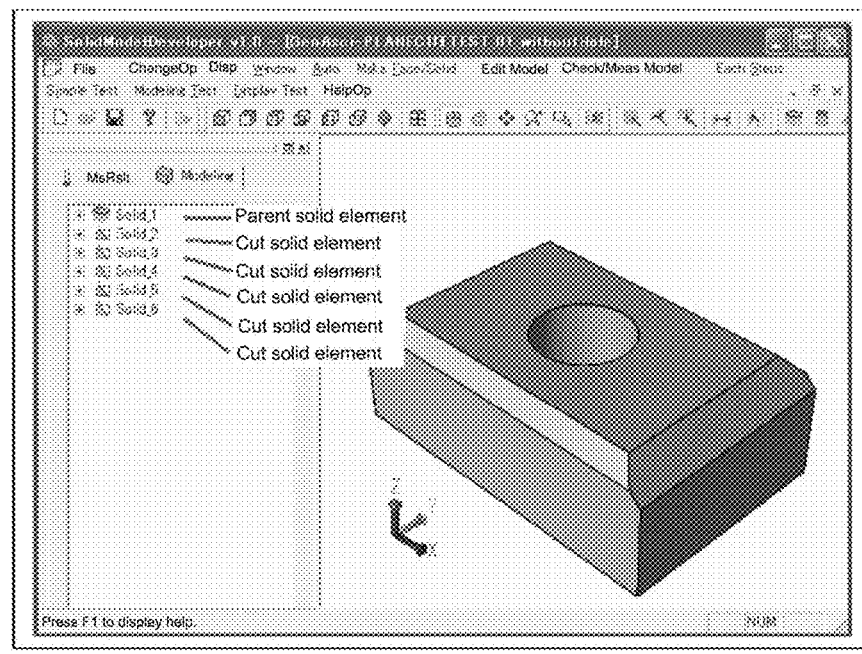
FIG. 17 illustrates another exemplary graphic output to the output device.

As shown in FIG. 16, in a case where the cut base plane is a cylindrical plane, a conical plane, or a spherical plane, for example, in step S203 of obtaining the cut direction, the direction in which the element is to be erased after slicing is toward an interior or toward an exterior of the cut base plane. In such a case, as shown in FIG. 16, an image I2 representing the cut direction may also be configured as a plurality of arrows representing a direction toward the interior or toward the exterior of the cut base plane.

As shown in FIG. 13, in step S204, the cut element is generated using the selected parent model element, the cut base plane, and the cut element generating parameters input using the input device 5.

As shown in FIG. 13, in step S205, the three-dimensional model is generated using the parent model element, the generated cut element, or the like. In the example shown in FIG. 17, a plurality of the cut elements Solid_2 to Solid_6 are generated using the above method and are combined with a single sweep element (Solid_1) to generate the three-dimensional model representing the measured object 1. The parent model element may also be a sweep element, or may be another three-dimensional model element. Even in a three-dimensional model generating method of this kind, similar results to those of the first to third embodiments can be achieved.

Fifth Embodiment

Figure 18:
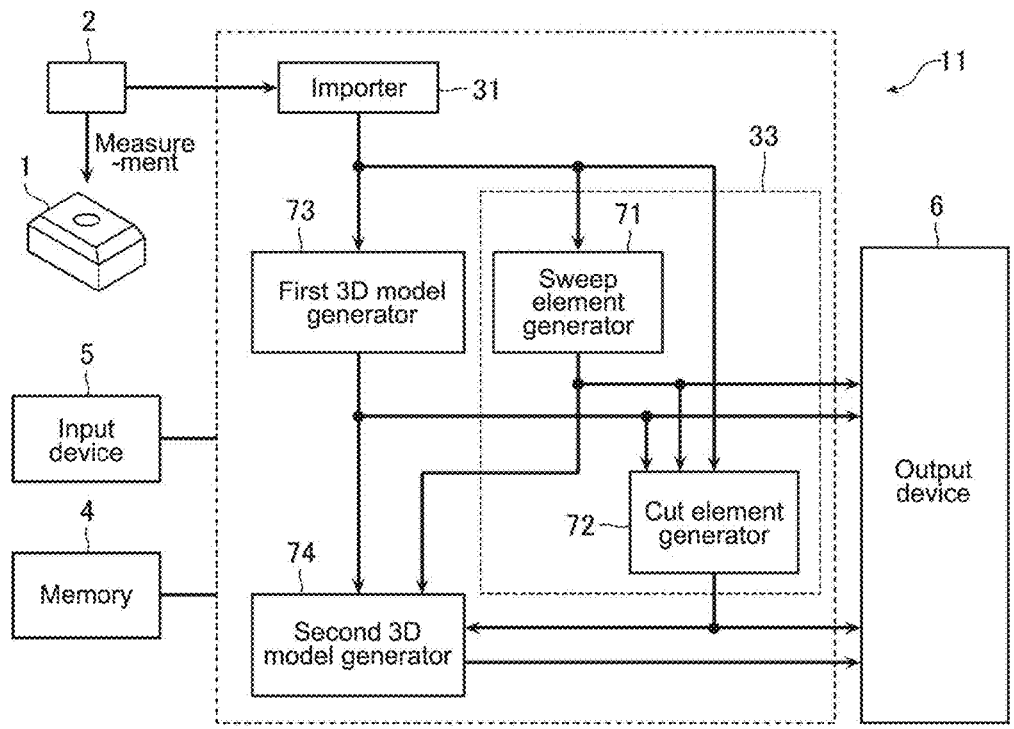
FIG. 18 is a block diagram of a three-dimensional model generating system according to a third embodiment of the present invention.
Figure 19:
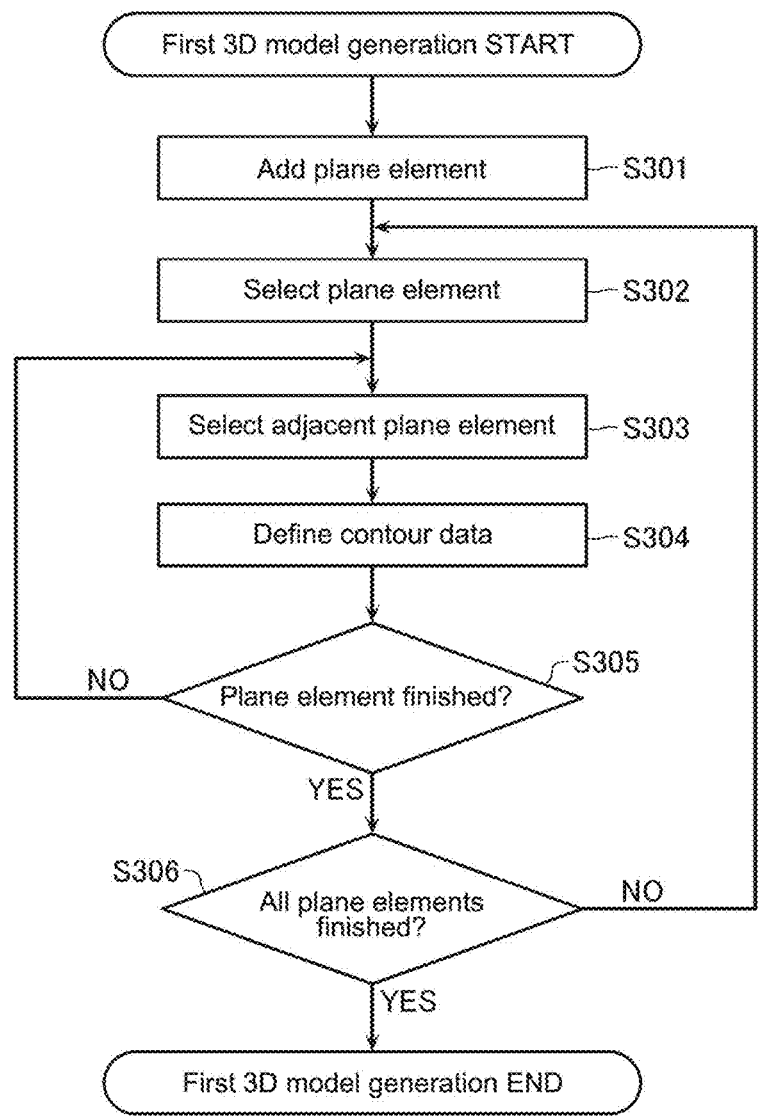
FIG. 19 is a flowchart illustrating a three-dimensional model generating method according to the third embodiment of the present invention.

Next, a three-dimensional model generating method according to a fifth embodiment of the present invention is described with reference to FIGS. 18 and 19. FIG. 18 is a block diagram of a three-dimensional model generating system 11 according to the present embodiment. FIG. 19 is a flowchart illustrating the three-dimensional model generating method according to the present embodiment. In the following description, portions similar to those of the first through fourth embodiments are assigned the same reference numerals, and a description thereof is omitted.

As shown in FIGS. 18 and 19, in the three-dimensional model generating method according to the present embodiment, a first three-dimensional model is generated automatically based on measurement data and is displayed on the output device 6. The first three-dimensional model automatically generated in this way may, for example, have a shape that differs from that of the measured object 1 in only one area. In some cases, such a difference in shape can be discovered comparatively easily by visual confirmation at this stage. Thus, the user can compare the shapes of the automatically generated first three-dimensional model and the measured object 1 and correct the first three-dimensional model as appropriate using the three-dimensional model elements, and thus a second three-dimensional model can be readily generated having a desired shape and accurate dimensions based on the measurement data.

As shown in FIG. 18, the three-dimensional model generating system 11 according to the present embodiment has a substantially similar configuration to that of the three-dimensional model generating system 10 according to the first embodiment. However, the three-dimensional model generating system 11 further includes a first three-dimensional model generator 73, which obtains information for intersections between plane elements and contour information for each plane element from the plane elements included in the measurement data and automatically generates the first three-dimensional model. In addition, the three-dimensional model element generator 33 of the three-dimensional model generating system 11 according to the present embodiment includes the sweep element generator 71 and the cut element generator 72 described above. Moreover, the three-dimensional model generating system 11 according to the present embodiment includes a second three-dimensional model generator 74 correcting the first three-dimensional model using the sweep elements, cut elements, and the like, and generating the second three-dimensional model.

Next, a first three-dimensional model generating method according to the present embodiment is described with reference to FIG. 19. In the present embodiment, a bottom surface of the measured object 1 is not measured. Accordingly, a plane element representing the bottom surface of the measured object 1 is first added (step S301). Flat plane data identical to the base plane may be added as the plane element. Next, the plane elements in the measurement data are sequentially selected (step S302), then a plane element or a plane element adjacent to a selected plane element is sequentially selected as an adjacent plane element (step S303). Next, a line of intersection between the selected plane element and the adjacent plane element is found by a sweep process, for example, and is defined as contour data (e.g., B-Reps) (step S304). At that point, in a case where a line of intersection intersects with the defined line of intersection, the intersection point between the lines of intersection is also defined. Steps S302 and S303 are repeated for all of the adjacent plane elements adjacent to the selected plane element (step S305), and a similar operation is performed for all plane elements (step S306).

Sixth Embodiment

Figure 20:
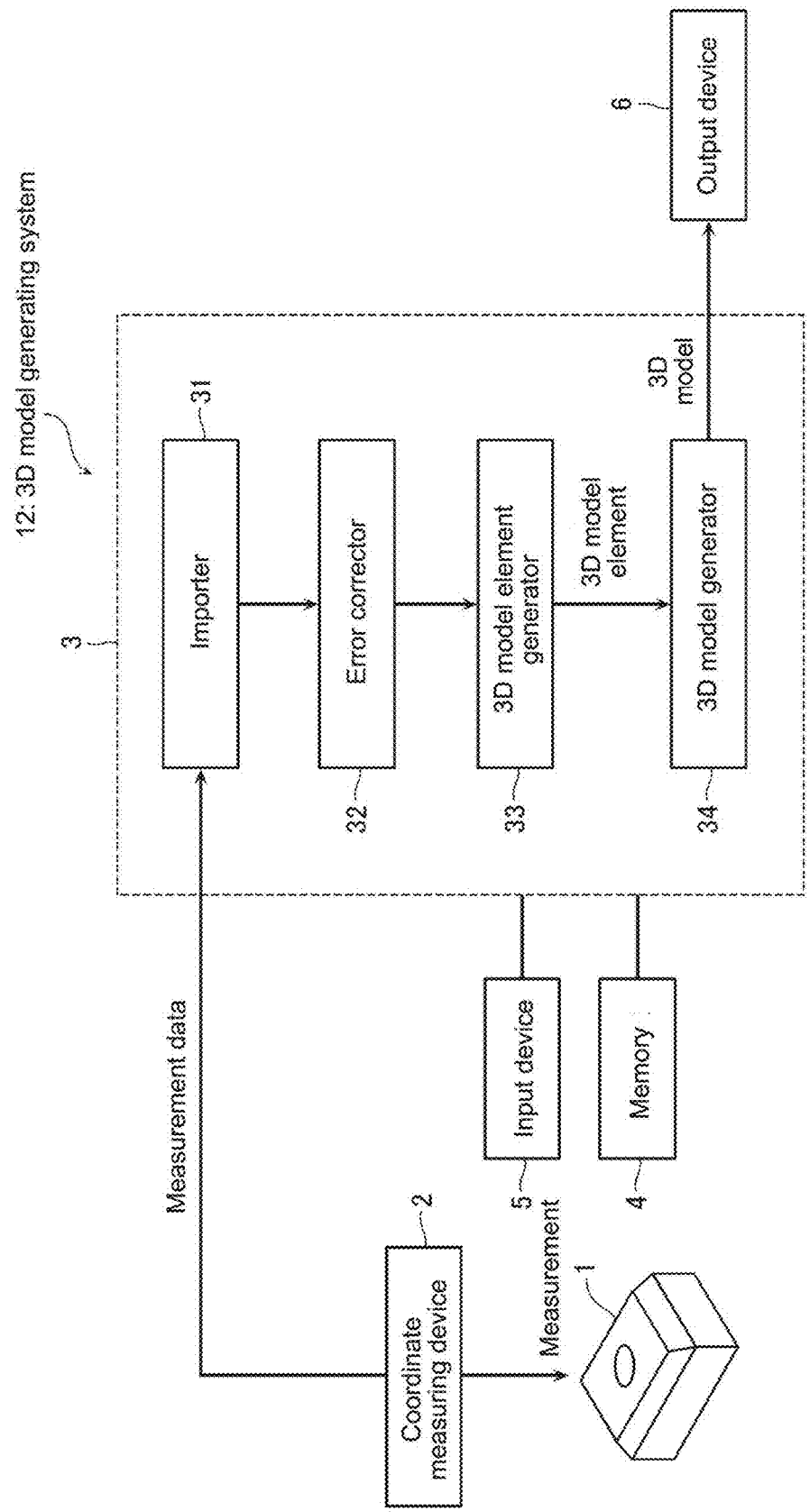
FIG. 20 is a block diagram of a three-dimensional model generating system according to a fourth embodiment of the present invention.

Next, a three-dimensional model generating method according to a sixth embodiment of the present invention is described with reference to FIGS. 20 and 21. FIG. 20 is a block diagram of a three-dimensional model generating system 12 according to the present embodiment. In the following description, portions similar to those of the first through fifth embodiments are assigned the same reference numerals, and a description thereof is omitted.

As shown in FIG. 20, the three-dimensional model generating system 12 according to the present embodiment has a configuration that is basically similar to that of the three-dimensional model generating system 10 according to the first embodiment. However, the three-dimensional model generating system 12 includes an error corrector 32 correcting an inclination of a plane element. In the following, a plane on which the measured object 1 is positioned is designated a base plane, and a straight line perpendicular to the base plane is designated a base axis.

Figure 21:
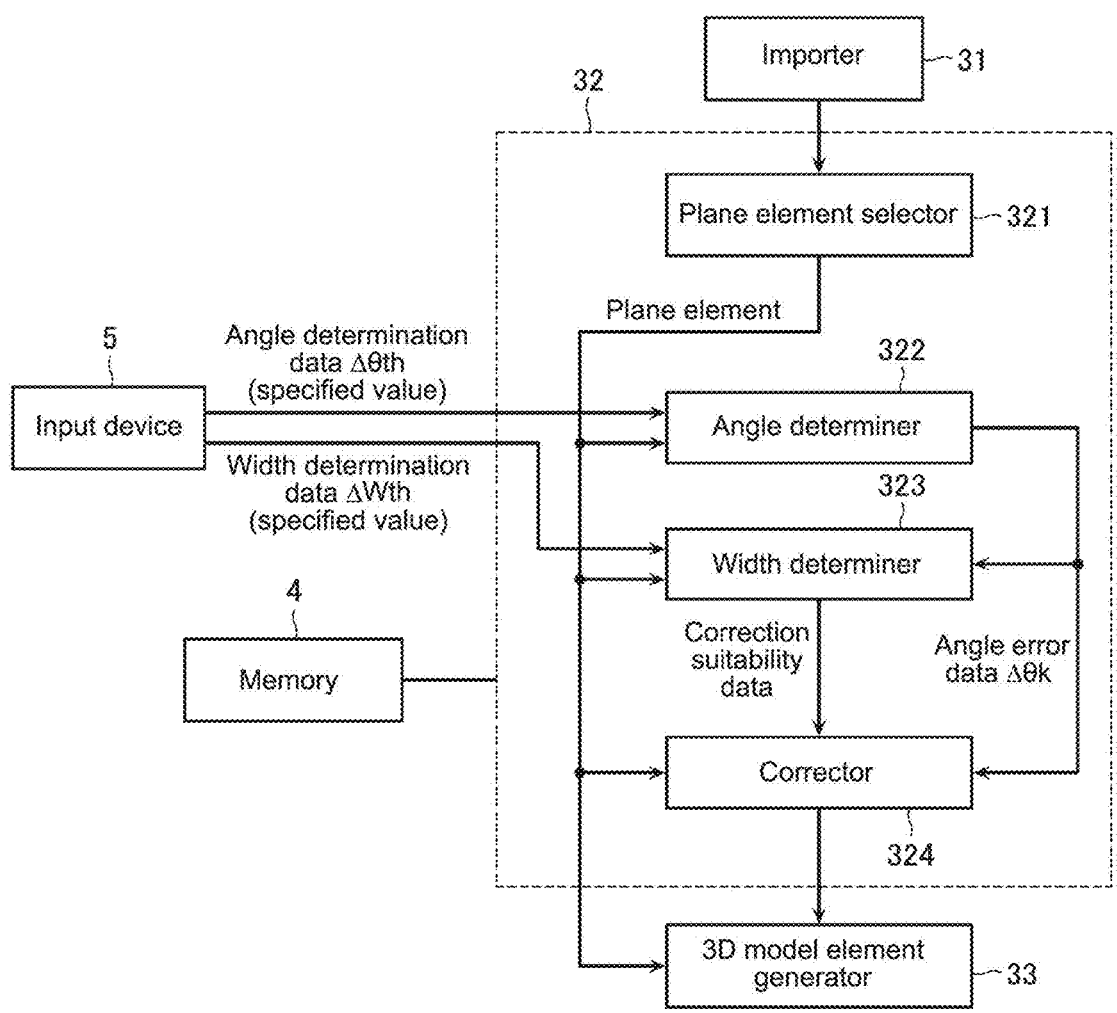
FIG. 21 is a block diagram of a configuration of an error corrector according to the fourth embodiment of the present invention.

FIG. 21 is a block diagram of the error corrector 32. As shown in FIG. 21, the error corrector 32 includes a plane element selector 321 sequentially selecting one plane element from the plane elements in the measurement data input via the importer 31; an angle determiner 322 determining an angle of inclination of the selected plane element; a width determiner 323 determining an occupied width of the plane element; and a corrector 324 correcting the inclination of the plane element in accordance with the determination results.

In a case where the selected plane element is a flat plane element, the angle determiner 322 performs angle determination determining whether an angle error formed by the base plane and a plane identified by the geometric values of the plane element is equal to or less than angle determination data $\Delta\theta th$ (specified value). In a case where the selected plane element is a cylindrical plane element, a conical plane element, a toroid plane element, or the like, the angle determiner 322 performs angle determination determining whether the angle error formed by the base axis and a center axis identified by the geometric values of the plane element is equal to or less than the angle determination data $\Delta\theta th$. As a result of the angle determination, in a case where the angle error is equal to or less than the predetermined angle determination data $\Delta\theta th$, angle error data $\Delta\theta k$ is output as a correction value.

The width determiner 323 determines the width occupied by measurement point group data, with a flat or curved plane identified by the geometric values of the selected plane element as a reference. In a case where the plane element is a flat plane, the determination using the width occupied by the measurement point group data is performed for a region where the measurement point group data is projected onto the plane element identified by the geometric values of the plane element. In a case where the plane element is a cylindrical element or a conical element, the determination using the width occupied by the measurement point group data is performed for a region where the measurement point group data is projected onto an axis of the plane element identified by the geometric values of the plane element. The width occupied by the measurement point group data is expressed by a normal direction distance from the plane element identified by the geometric values to each measurement point. The width determiner 323 determines whether the width occupied by the measurement point group data is equal to or less than width determination data $\Delta Wth$ (specified value) and outputs correction suitability data as the determination result. The angle determination data $\Delta\theta th$ and the width determination data $\Delta Wth$ can be specified ahead of time using the input device 5.

In a case where the error was determined to be equal to or less than the specified value in both the angle determination and the width determination, the corrector 324 obtains the angle error $\Delta\theta k$, corrects the plane element by the amount of the angle error $\Delta\theta k$, and outputs the corrected plane element. As a result, the plane represented by the plane element is lined up so as to be identical, parallel, or perpendicular to the base plane, or the center axis of the plane element is lined up so as to be identical, parallel, or perpendicular to the base axis. In a case where the angle error is determined to be larger than the angle determination data $\Delta\theta th$ in the angle determination, or where the occupied width is determined to be larger than the width determination data $\Delta Wth$ in the width determination, no correction of the plane element is performed.

According to this method, the error can be corrected, enabling generation of an accurate three-dimensional model. In addition, a situation can be prevented in which an intentional inclination provided to a plane by design is mistakenly identified as an error and corrected.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular structures, materials and embodiments, the present invention is not intended to be limited to the particulars disclosed herein; rather, the present invention extends to all functionally equivalent structures, methods and uses, such as are within the scope of the appended claims.

The present invention is not limited to the above described embodiments, and various variations and modifications may be possible without departing from the scope of the present invention.

What is claimed is:

1. A three-dimensional model generating method utilizing a calculator that generates a three-dimensional model based on measurement data, which includes measurement point group data obtained by measuring a three-dimensional measured object, a type of a plane element, and geometric values of the plane element, the method comprising:
    scanning, via a coordinate measuring device, the three-dimensional object for obtaining the measurement data of a plurality of planes of the three-dimensional object, the measurement data including the measurement point group data, the type of the plane element for each of the plurality of planes of the three-dimensional object, and the geometric values for each of the plurality of planes of the three-dimensional object;
    displaying, on a display, a window with a listing of the plurality of planes of the three-dimensional object for selection;
    selecting, via the calculator, one of the plurality of the plurality of planes as a sweep base plane;
    selecting, via the calculator, another plane among the plurality of planes, the other plane defining contour lines and intersecting points based on the sweep base plane;
    generating, via a three-dimensional model element generator, a three-dimensional model element based on the sweep plane, the contour lines and the intersecting points as a sweep element, the three-dimensional model element representing a shape of at least a portion of the three-dimensional model based on the measurement data using a predetermined method, the three-dimensional model element being defined by a plane element and a predetermined condition;

generating, via a three-dimensional model generator, the three-dimensional model using one or a plurality of three-dimensional model elements, the plurality of three-dimensional model elements including the sweep element;

selecting, via the calculator and when generating the three-dimensional model, the predetermined plane element defining the three-dimensional model element from the measurement data;

obtaining, via the calculator and when generating the three-dimensional model, the condition required to generate the three-dimensional model element;

generating, via the calculator and when generating the three-dimensional model, the three-dimensional model element using the selected plane element and the obtained condition; and generating, via the calculator and when generating the three-dimensional model, the three-dimensional model of the measured object using one or a plurality of three-dimensional model elements.

2. The three-dimensional model generating method according to claim 1, further comprising:

representing, via the calculator, a three-dimensional shape as the three-dimensional model element using a locus for a case where a predetermined flat planar shape is displaced in a predetermined direction;

using, via the calculator, a sweep base plane defining a flat plane occupied by the flat planar shape, a closed contour set defining a shape on the flat planar sweep base plane, and a sweep element defined by a direction and distance over which the flat planar shape is displaced;

selecting, via the calculator and when generating the three-dimensional model, a predetermined plane element from the measurement data as the sweep base plane;

selecting, via the calculator and when generating the three-dimensional model, a second appropriate plane element intersecting with the sweep base plane, generates a contour line using a line of intersection between the sweep base plane and the second plane element, and generates a closed contour set using a plurality of contour lines and a plurality of points where the contour lines intersect with each other;

obtaining, via the calculator and when generating the three-dimensional model, a direction and distance over which a sweep occurs as the condition;

generating, via the calculator and when generating the three-dimensional model, the sweep element using the selected sweep base plane, the generated closed contour set, and the obtained direction and distance over which the sweep occurs; and generating, via the calculator and when generating the three-dimensional model, the three-dimensional model using one or a plurality of sweep elements.

3. The three-dimensional model generating method according to claim 2, further comprising:

extracting, via the calculator and when generating the closed contour set, the plane element intersecting with the sweep base plane from the measurement data;

automatically generating, via the calculator and in a case where the contour lines can be extrapolated, the closed contour set; and creating, via the calculator and in a case where the contour lines cannot be extrapolated, a list of plane elements intersecting with the sweep base plane.

4. The three-dimensional model generating method according to claim 2, further comprising:

automatically generating, via the calculator and when generating the closed contour set and in a case where points where the plurality of contour lines intersect with each other can be extrapolated, the closed contour set; and creating, via the calculator and in a case where the points where the plurality of contour lines intersect with each other cannot be extrapolated, a list of intersection points.

5. The three-dimensional model generating method according to claim 1, further comprising:

representing, via the calculator, a three-dimensional shape as the three-dimensional model element by slicing a given three-dimensional shape with a predetermined flat or curved plane;

using, via the calculator, a parent model element, which is the three-dimensional shape to be sliced, a cut base plane defining a slicing plane, and a cut element defined using a cut direction indicating a direction in which the element is erased after slicing;

selecting, via the calculator and when generating the three-dimensional model, the sweep element as the parent model element;

selecting, via the calculator and when generating the three-dimensional model, the predetermined plane element from the measurement data as the cut base plane;

obtaining, via the calculator and when generating the three-dimensional model, the cut direction as the condition;

generating, via the calculator and when generating the three-dimensional model, the cut element using the parent model element, the selected cut base plane, and the cut direction; and generating, via the calculator and when generating the three-dimensional model, the three-dimensional model using one or a plurality of the parent model elements and the cut elements.

6. The three-dimensional model generating method according to claim 5, further comprising:

extracting, via the calculator and when selecting the cut base plane, the plane element intersecting with the parent model element from the measurement data;

creating, via the calculator and in a case where there are a plurality of plane elements intersecting with the parent model element, a list of the plane elements intersecting with the parent model element; and automatically selecting, via the calculator and in a case where only one plane element intersects with the parent model element, the cut base plane.

7. The three-dimensional model generating method according to claim 5, further comprising:

generating, via the calculator and when obtaining the cut direction, a three-dimensional image in which the parent model element, the cut base plane, and an image of an arrow or the like representing the cut direction overlap;

obtaining, via the calculator and when obtaining the cut direction, the cut direction based on input from the input device.

8. The three-dimensional model generating method according to claim 1, further comprising:

obtaining from the plane elements, via a first three-dimensional model generator of the calculator, information for intersections between plane elements and contour information for each plane element;

automatically generating, via the first three-dimensional model generator of the calculator, a first three-dimensional model;

automatically generating, via the calculator and when generating the three-dimensional model, the first three-dimensional model;

generating, via the calculator and when generating the three-dimensional model, the three-dimensional model element; and correcting, via the calculator and when generating the three-dimensional model, the first three-dimensional model using one or a plurality of the three-dimensional model elements.

9. The three-dimensional model generating method according to claim 1, further comprising setting, by the calculator, a sweep direction and corresponding distance.

10. The three-dimensional model generating method according to claim 1, further comprising defining, by the calculator, a closed contour set based on the sweep plane, the defined contour lines, and the intersecting points.

11. A three-dimensional model generating system comprising:

a calculator configured to generate a three-dimensional model based on measurement data, which includes measurement point group data obtained by measuring a measured object, a type of a plane element, and geometric values of the plane element, the calculator is configured to:

scan the three-dimensional object for obtaining the measurement data of a plurality of planes of the three-dimensional object, the measurement data including the measurement point group data, the type of the plane element for each of the plurality of planes of the three-dimensional object, and the geometric values for each of the plurality of planes of the three-dimensional object;

display, on a display, a window with a listing of the plurality of planes of the three-dimensional object for selection;

select one of the plurality of the plurality of planes as a sweep base plane;

select another plane among the plurality of planes, the other plane defining contour lines and intersecting points based on the sweep base plane;

generate a three-dimensional model element based on the sweep plane, the contour lines and the intersecting points as a sweep element, the three-dimensional model element representing a shape of at least a portion of the three-dimensional model based on the measurement data using a predetermined method, the three-dimensional model element being defined by a plane element and a predetermined condition;

generate the three-dimensional model using one or a plurality of three-dimensional model elements, the plurality of three-dimensional model elements including the sweep element, wherein, when generating the three-dimensional model, the calculator is further configured to:

select the predetermined plane element defining the three-dimensional model element from the measurement data;

obtain the condition required to generate the three-dimensional model element;

generate the three-dimensional model element using the selected plane element and the obtained condition; and generate the three-dimensional model of the measured object using one or a plurality of the three-dimensional model elements.

12. A non-transitory computer-readable storage that stores a three-dimensional model generating program product utilizing a calculator and generating a three-dimensional model based on measurement data, which includes measurement point group data obtained by measuring a measured object, a type of a plane element, and geometric values of the plane element, the three-dimensional model generating program product causing the computer to execute a process comprising:

scanning, via a coordinate measuring device, the three-dimensional object for obtaining the measurement data of a plurality of planes of the three-dimensional object, the measurement data including the measurement point group data, the type of the plane element for each of the plurality of planes of the three-dimensional object, and the geometric values for each of the plurality of planes of the three-dimensional object;

displaying, on a display, a window with a listing of the plurality of planes of the three-dimensional object for selection;

selecting, via the calculator, one of the plurality of the plurality of planes as a sweep base plane;

selecting, via the calculator, another plane among the plurality of planes, the other plane defining contour lines and intersecting points based on the sweep base plane;

generating, via a three-dimensional model element generator, a three-dimensional model element based on the sweep plane, the contour lines and the intersecting points as a sweep element, the three-dimensional model element representing a shape of at least a portion of the three-dimensional model based on the measurement data using a predetermined method, the three-dimensional model element being defined by the plane element and a predetermined condition;

generating, via a three-dimensional model generator, the three-dimensional model using one or a plurality of three-dimensional model elements, the plurality of three-dimensional model elements including the sweep element;

selecting, via the calculator and when generating the three-dimensional model, the predetermined plane element defining the three-dimensional model element from the measurement data;

obtaining, via the calculator and when generating the three-dimensional model, the condition required to generate the three-dimensional model element;

generating, via the calculator and when generating the three-dimensional model, the three-dimensional model element using the selected plane element and the obtained condition; and generating, via the calculator and when generating the three-dimensional model, the three-dimensional model of the measured object using one or a plurality of three-dimensional model elements.

* * * * *